(12) United States Patent
Leon

(10) Patent No.: US 7,279,912 B2
(45) Date of Patent: Oct. 9, 2007

(54) DUAL ARCUATE BLADE PROBE TIP

(75) Inventor: Alexander Leon, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 21 days.

(21) Appl. No.: 11/250,032

(22) Filed: Oct. 13, 2005

(65) Prior Publication Data

US 2007/0085555 A1    Apr. 19, 2007

(51) Int. Cl.
*G01R 31/02* (2006.01)

(52) U.S. Cl. .............. 324/754; 324/761; 324/762

(58) Field of Classification Search ............. None
See application file for complete search history.

(56) References Cited

U.S. PATENT DOCUMENTS

| | | | |
|---|---|---|---|
| 4,468,615 A * | 8/1984 | Jamet et al. | ............ 324/754 |
| 4,783,624 A | 11/1988 | Sabin | |
| 4,885,533 A | 12/1989 | Coe | |
| 5,557,213 A | 9/1996 | Reuter et al. | |
| 5,685,725 A * | 11/1997 | Uratsuji | .............. 439/71 |
| 5,731,710 A | 3/1998 | Mizuno et al. | |
| 6,404,213 B2 * | 6/2002 | Noda | ............ 324/754 |
| 6,538,424 B1 | 3/2003 | Campbell | |
| 6,809,535 B2 | 10/2004 | Campbell | |

* cited by examiner

*Primary Examiner*—Minh N. Tang

(57) ABSTRACT

Provided is a dual arcuate blade probe tip for probing a node, such as a node hole, on a circuit. The probe has a shaft made from an electrically conductive material, concentric to a longitudinal probe axis, and two separate arcuate edges coupled to the shaft and positioned transverse to the probe axis. The arcuate edges define a self-cleaning space therebetween, avoiding blockage of the probe by debris. The arcuate edges provide two single points of contact to concentrate applied force from the shaft to the node hole. The shaft may also include a plunger and/or a structure to prevent rotation of the probe about the probe axis.

34 Claims, 8 Drawing Sheets

DUAL ARCUATE BLADE PROBE TIP

FIELD

This invention relates generally to the field of electrical test probes and, in particular, to a dual arcuate blade probe.

BACKGROUND

Typically, modern electrical products incorporate printed circuit assemblies (PCAs), such as printed circuit boards (PCBs). The range of products is immense, including cell phones, laptops televisions, MP3 players, game consoles, personal data assistant and aircraft components, to name just a few.

The printed circuits within these products interconnect a variety of circuit components, such as diodes, transistors, resistors, integrated circuits and the like. Fabricated as individual components, each generally has one or more legs or pins (commonly referred to as leads). The individual components are brought into useful harmony by a circuit board that provides electrical traces to and from different components as well as areas that facilitate the permanent mounting of components upon the board.

Due to fabrication complexity of many products, the PCAs are assembled in stages. A given PCA and at least some of the components thereon may therefore be subjected to repeated processing steps. As such, the components frequently require monitoring and testing during the fabrication process to insure that the ultimate device is functional. If an uncorrectable defect is detected early, additional fabrication costs may be saved by halting further assembly of the defective product.

Electrical test probes are used to provide electrical connections between PCA components and testing instruments. An electrical test probe generally consists of an electrically conductive probing tip joined to an electrically conductive shaft that is in turn connected to a test fixture, which attempts to align the probe to a specific component.

Generally speaking, the components are attached to the PCA by solder. Economic and environmental factors have effected a change in the solder process from lead based solder to lead free solder. The use of lead free solder imposes additional fabrication issues upon the assembly and testing process. For through-hole-technology (THT) components, the process and costs of wave soldering can be eliminated by assembling these to the board using through-hole reflow (THR). THR is a way to mount THT components simultaneously with the surface-mount-technology (SMT) components. Typically, the solder is applied in a paste form with the use of a stencil to the circuit board. Components are then pressed into the solder paste, and/or into holes in the board along with solder paste. The board is then heated to the solder melt temperature to reflow the solder such that it wets a pad surface and/or flows about the pins of a component to be joined to the board. In addition to the solder metal, the solder paste also contains a combination of chemicals called flux, which help keep the solder in a paste form, act as adhesive so the paste sticks to the pads and pins, thereby holding the components on the board before being reflowed, and clean the metal of pads and pins in order to achieve a good solder joint. The reflowing process releases the flux components of the paste and leaves flux residue on the board and solderjoints. The flux residue is a combination of non-conductive materials.

Holes in the board are frequently used to mount components and/or provide board interconnections. When the reflowed solder flows into these holes it may partially or completely fill them. Flux material also will flow into the hole and gather on top of the reflowed solder. The flux material may lie below the pad of the hole, be flush with the it or flood over it.

When the hole and/or its surrounding pad are the target of a test probe, the flux residue may prevent a reliable and repeatable electrical connection between the pad and the target when urged with each other. Also, a certain amount of force is generally used when the test probe tip is urged into the solder. If too much force is applied, this may break solder joints, components or the board itself. If too little force is applied the probe may not make sufficient contact with the solder and a valid component may be judged to be defective. Thus, a low force that repeatably makes good electrical contact between a test probe and its target is desirable.

Most conventional test probe tips are generally in the shape of a cone or other shape that narrows to a point. Such a point in line with the probe's longitudinal axis permits a concentration of force in line with that axis, and thus also limits probe wear. With respect to a through hole filled with solder having concave meniscuses in turn filled by flux residue pooled therein, the conventional probes point targets the deepest portion of the flux pool. Attempts to contact the solder may thus be frustrated, and testing may fail despite the node actually being properly functional.

Probe tips in the shapes of cups, crowns and radial stars with three or more tips for alignment over mounded solder elements also exist. However, as the number of contact points increases, so too does the surface area of contact. More specifically, as the points of contact increase, the concentration of applied force transferred to each point decreases.

This can be illustrated by the example of a man on snow shoes. The man may walk across a soft snow because the snow shoes distribute his weight upon the snow across a large surface area. In a more specific example, a force magnitude of 12 units (arbitrary) applied by a single point to a surface will transfer a force magnitude of 12. The same force applied by three points sees each point apply a force magnitude of only 4—a third of the total force (12÷3=4). In other words, the contact force applied by the plunger is divided by the number of contact points, resulting in a lower contact force per tip. Materials limit how small the contact surface area of each tip can be made. Thus the pressure applied by a single tip probe will be three times higher than that applied by each tip of a three tip probe—assuming all tips have equivalent contact surface areas.

Thus, the multiplicity of points of contact from start tips, crown tips or the like may further frustrate the attempt to achieve a proper electrical contact between the probe tip and the solder. Single flat blade probe tips are likewise also frustrated by the presence of flux, as they provide a large surface area for contact and thus result in lower contact pressure per unit of contact area.

In addition, cupped tips and multi point tips may easily be fowled by flux material. As the probe tip attempts to reach the solder below the flux material, the flux material is compacted into the cup and/or between and about the multiple tips. Such material may collect to such a point where the probe tips are simply unable to make electrical contact, with even clean test locations.

In short, single point tips are not well suited for probing through holes clogged or capped by flux material as the single point tip tends to be aligned for center of the hole where the flux material is most thick. Flat blade probe tips and tips with three or more tips result in force distribution over an increased surface area. Multi-point tips, which may avoid the thick portions of flux material, have less force to penetrate through the flux residue and are easily fouled by flux collecting at the probe tip, and are therefore unable to make repeatable and reliable electrical contact.

Consequently, the necessary electrical contact between the probe and the solder is not achieved in all situations and the testing system may wrongly evaluate a healthy board and/or component as defective, due simply to the contact failure. Also, bad contact may lead to incorrectly passing a bad board. Such incorrect evaluations are costly, either due to costly troubleshooting involved, good product becoming scrapped or profitability being impacted by bad product becoming deployed and in turn necessitating costly customer support under warranty.

Hence, there is a need for a device that overcomes one or more of the drawbacks identified above.

SUMMARY

This invention provides a contact probe tip for probing a node on a circuit.

In particular, and by way of example only, according to an embodiment, provided is a dual arcuate blade probe tip for probing a node on a circuit, including: a longitudinal probe axis; a shaft made from an electrically conductive material, the shaft concentric to the probe axis; and two separate arcuate edges coupled to the shaft and positioned about the probe axis, each arcuate edge transverse to the probe axis.

DETAILED DESCRIPTION

Before proceeding with the detailed description, it is to be appreciated that the present teaching is by way of example, not by limitation. The concepts herein are not limited to use or application with a specific light guide screen. Thus, although the instrumentalities described herein are for the convenience of explanation, shown and described with respect to exemplary embodiments, it will be appreciated that the principles herein may be equally applied in other types of dual arcuate blade probes.

Referring now to the drawings, and more specifically FIGS. 1–4, there is shown a dual arcuate blade probe tip, hereinafter referred to as a dual arcuate blade probe tip 100, for probing a node on a circuit. The dual arcuate blade probe 100 has a longitudinal probe axis 102, a shaft 104 concentric to the probe axis 102, and two separate arcuate blade edges 106, 108 provided at the probe tip 110. In at least one embodiment, the two arcuate edges 106, 108 are provided by blades 112 and 114 respectively.

The two separate arcuate blade edges 106, 108 are coupled to the shaft 104 and positioned about the probe axis 102, and provide the apex of tip 110. Each arcuate blade edge 106, 108 is transverse to the probe axis 102. In at least one embodiment, the arcuate edges 106, 108 are coupled to the shaft 104 on opposing sides of the probe axis 102. Moreover, in at least one embodiment the arcuate edges 106, 108 lie in the same plane 308 (see FIG. 3), the plane parallel to and including the probe axis 102. Such a configuration may provide a dual arcuate blade probe 100 that is symmetric about probe axis 102. In at least one alternative embodiment, the arcuate edges 106, 108 do not lie in the same plane, and as such dual arcuate blade probe 100 is not symmetric about probe axis 102. In yet another alternative embodiment, the arcuate edges 106, 108 lie in the same plane, the plane parallel to (but not including) the probe axis 102.

Figure 3:
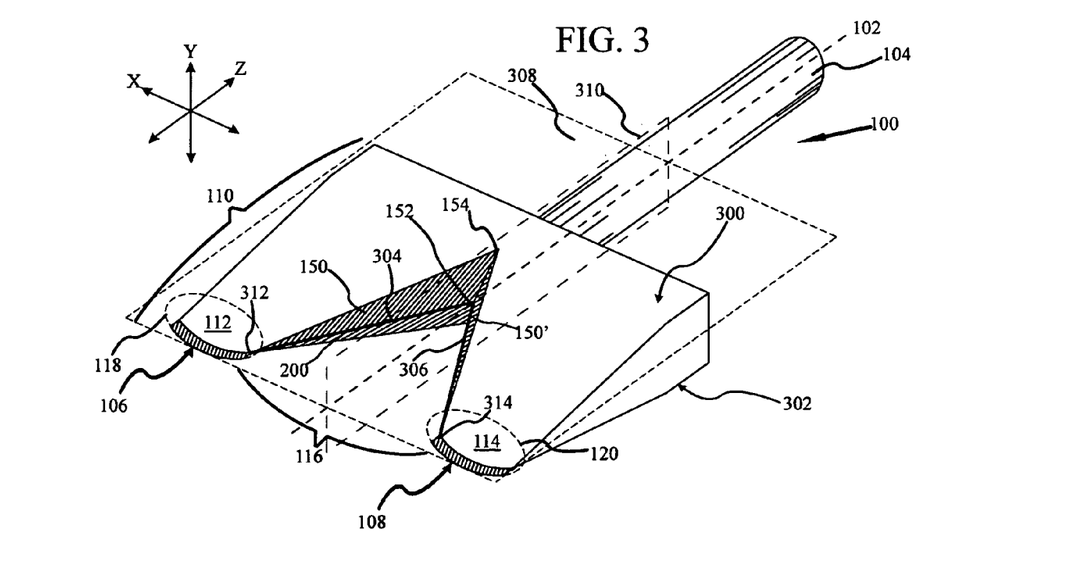
FIG. 3 shows a partial perspective view of a dual arcuate blade probe according to an embodiment.

The structure of dual arcuate blade probe 100 may be further appreciated with respect to the partial perspective provided in FIG. 3. Moreover, in at least one embodiment, the tip is defined by two opposing faces 300, 302 about the probe axis 102. The faces 300, 302 converge towards each other along a first axis (shown as the Z axis) substantially parallel to probe axis 102. The faces 300, 302 separate and taper to arcuate edges 106, 108 along a second axis (shown as the X axis) transverse to the probe axis 102. Moreover, the tapering and separating of the faces 300, 302 provide blades 112, 114 on opposing sides of probe axis 102. Each blade 112, 114 in turn respectively provides an arcuate edge 106, 108.

Arcuate blade edges 106, 108 further define an area or space 116 between the arcuate edges 106, 108. This space 116 divides the apex of tip 110 as provided by the arcuate edges 106, 108 and imposed upon the probe axis 102. As is further discussed below, space 116 is a self-cleaning space.

The profile of each arcuate blade edge 106, 108 is that of a circle, ellipse or other curved function, and/or combinations thereof. It is to be understood and appreciated that the arcuate edges 106, 108 are not straight line segments perpendicular to the probe axis 102. More specifically, arcuate edges 106, 108 are not planar contact surfaces. As shown in the figures, the arcuate profile is circular as each arcuate edge 106, 108 traces a portion of a circle denoted by circular dashed lines 118 and 120, respectively.

In at least one embodiment, the arcuate blade edges 106, 108 form part of a wave shaped edge which is transverse to the shaft 104. The wave edge provides the two arcuate blade edges in the form of peaks separated by a trough receding towards the shaft 104 along the probe axis, each peak disposed on opposite sides of the probe axis. At least a portion of each peak corresponds to each arcuate blade edge 106, 108, respectively. The trough therebetween corresponds to the self-cleaning space 116.

Figure 1:
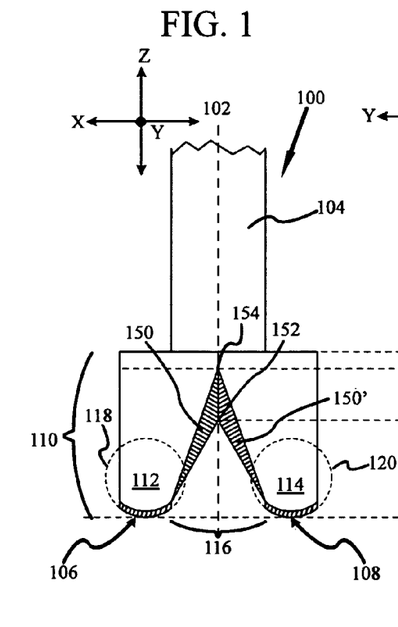
FIG. 1 shows a plane face view of a dual arcuate blade probe according to an embodiment.
Figure 2:
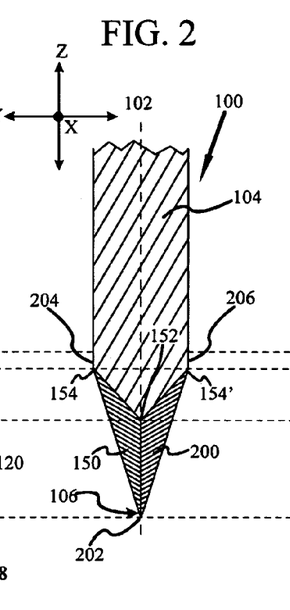
FIG. 2 shows a side view cross-section of the dual arcuate blade probe in FIG. 1.

FIG. 2 provides a side cross sectional view of the dual arcuate blade probe 100 shown in FIG. 1 along probe axis 102, showing one half of the self-cleaning space 116. As shown, the illustrated portion of self-cleaning space 116 is formed by a first surface 150 and a second surface 200 extending from the edge internal end apex 202 of tip 110 to the sides 204, 206 of tip 110 of dual arcuate blade probe 100.

With respect to FIGS. 1~3, self-cleaning space 116 has a central vertex area 152 disposed between the two blades 112, 114 in a first plane 308 (XZ plane, see FIG. 3) along the probe axis 102. The self-cleaning space 116 further has exit vertex areas 154 and 154' above the central area 152. The exit areas 154 and 154' are on a second plane 310 (YZ plane, see FIG. 3) along a second axis (shown as the Y axis). With respect to FIG. 3, it can be appreciated that the exit area 154 is above the central area 152 with respect to the Z axis as well as the Y axis. Specifically, there is a slope angle from the central area 152 out to the exit area 154.

As shown in FIG. 3, first surface 150 as shown is defined by arcuate edge 106 internal end apex 312, central area vertex 152 and exit area vertex 154. First surface 150' as shown is defined by arcuate edge 108 internal end apex 314, central area vertex 152, and exit area vertex 154. Second surface 200 is defined by arcuate edge 106 internal end apex 312, central area vertex 152 and exit area vertex 154' (see FIG. 2). A second surface 200' (not viewable in FIG. 3; see FIG. 13) is defined by arcuate edge 108 internal end apex 314, central area vertex 152, and exit area vertex 154' (see FIG. 2).

Collectively, the first and second surfaces 150, 150', 200, 200' provide the self-cleaning aspect to self-cleaning space 116. As dual arcuate blade probe 100 is brought into contact with a node for testing, debris such as solder residue, flux, dirt or other materials may enter self-cleaning space 116. The sloping angles of the first and second surfaces 150, 150', 200, 200' advantageously insure that such debris will be deflected away from the axis of the probe and will not lodge in self-cleaning space 116.

Figure 4:
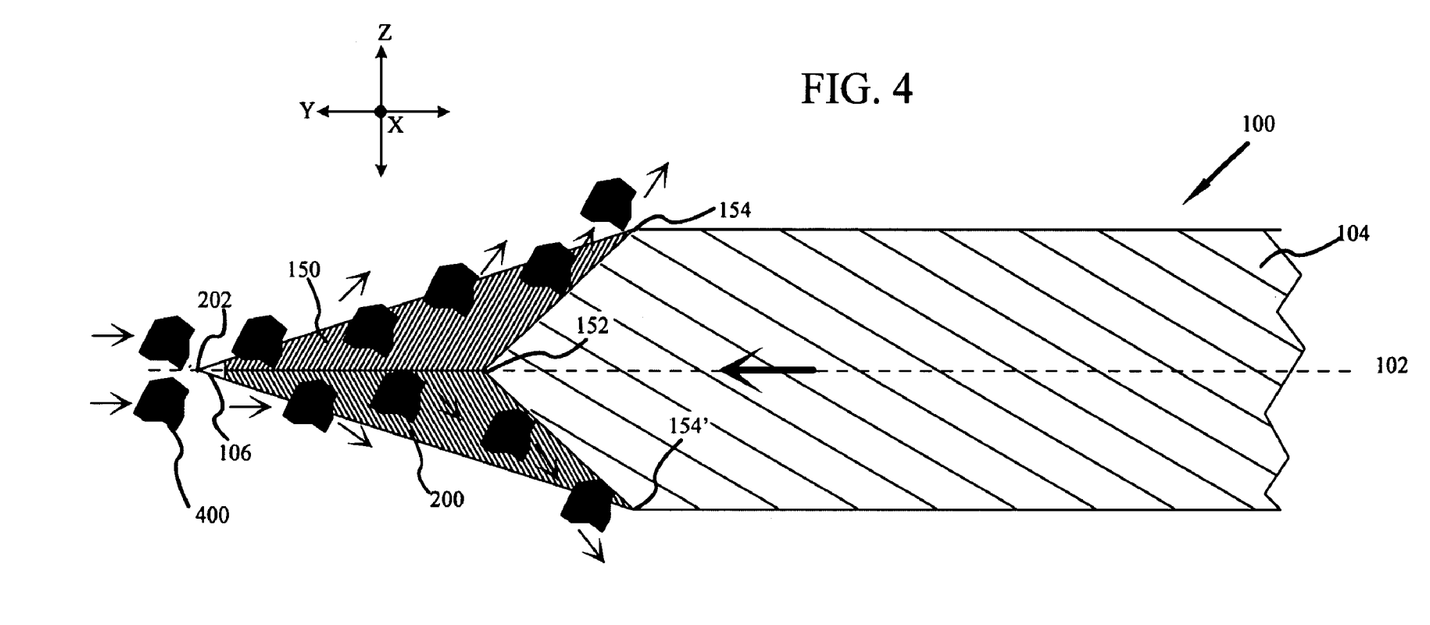
FIG. 4 shows a side view cross-section of a dual arcuate blade probe showing a self-cleaning space deflecting debris, according to an embodiment.

More specifically, first surface 150 and second surface 200 share common edge 304 between arcuate edge 106 internal end apex 312 and central area vertex 152. Likewise, first surface 150' and second surface 200' share common edge 306 between arcuate edge 108 internal end apex 314 and central area vertex 152. As shown in FIG. 4, any material 400 approaching from the apex of tip 110 and striking either first surface 150 or second surface 200 is deflected away from probe axis 102 and thus away from dual arcuate blade probe 100.

As no cavity, bore or other semi-enclosed structure is provided within self-cleaning space 116, self-cleaning space 116 is incapable of trapping and collecting debris materials. Should any debris materials collect upon first or second surfaces 150, 150', 200, 200', new debris materials entering self-cleaning space 116 in subsequent probing cycles push the collected material along the first and second surfaces 150, 150', 200, 200' away from the probe axis 102 and, as such, prevents the fouling of tip 110.

Figure 5:
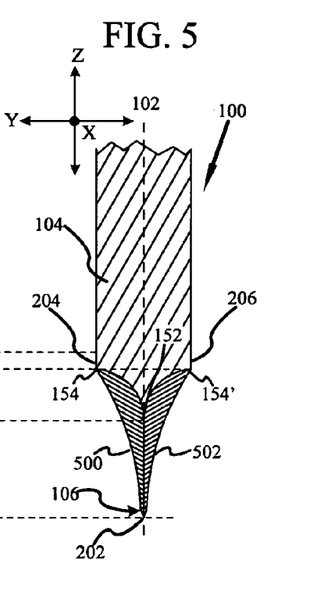
FIG. 5 shows a side view cross-section of an alternative embodiment configuration for the dual arcuate blade probe shown in FIG. 1.

FIG. 5 provides an alternative side view cross section of the dual arcuate blade probe 100 shown in FIG. 1 along probe axis 102. Whereas in FIG. 2 the portion of self-cleaning space 116 is shown with generally flat first and second surfaces 150, 200, in FIG. 5, the first and second surfaces 500, 502 are shown as being curvilinear. Such a curvilinear surface may be advantageous in at least one embodiment to further enhance the self-cleaning aspect of self-cleaning space 116 and as an alternate to facilitate manufacturing.

Figure 6:
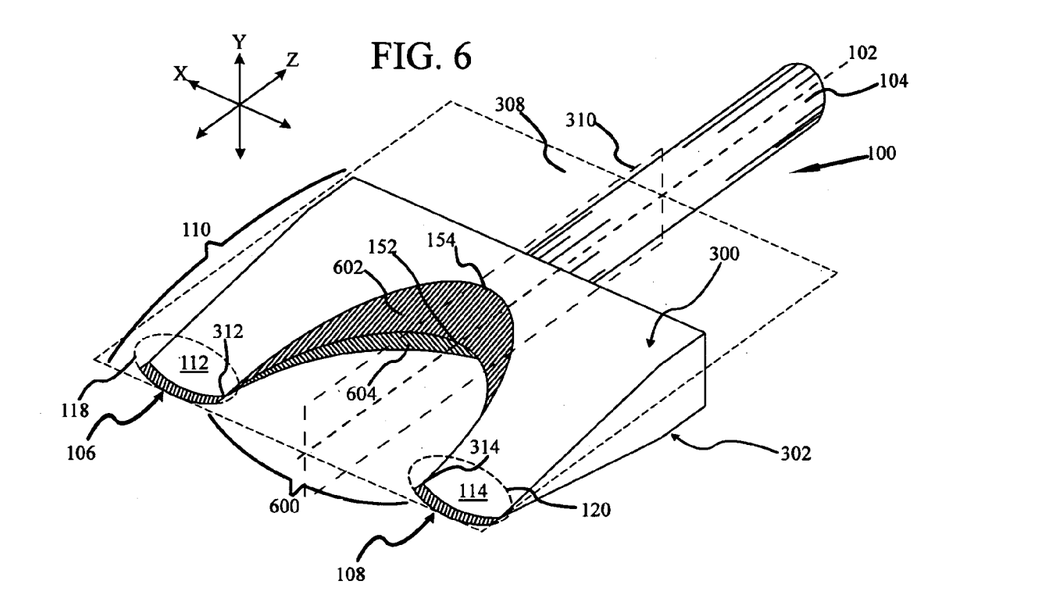
FIG. 6 is a partial perspective view of an alternative dual arcuate blade probe.
Figures 7, 8:
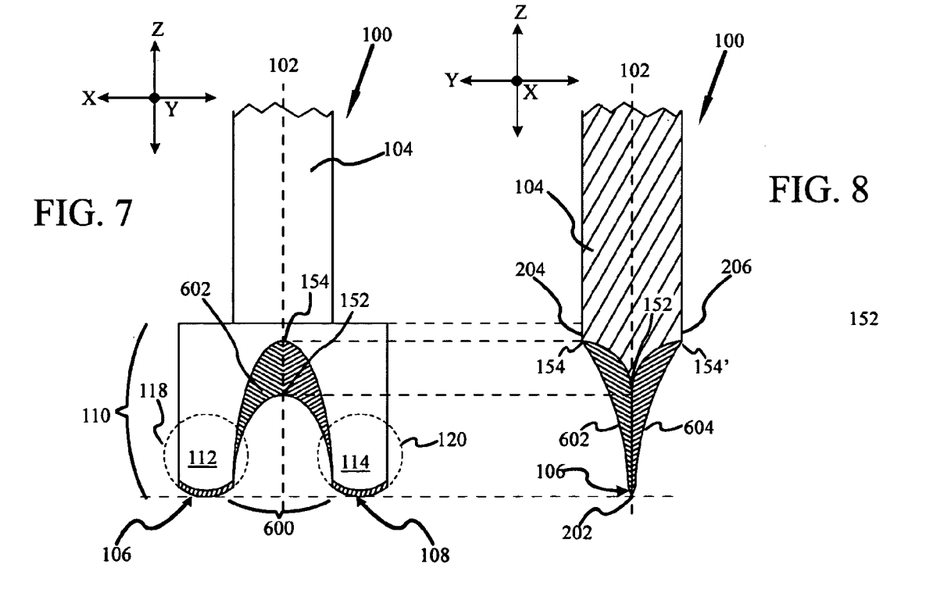
FIG. 7 is a plane face view of the dual arcuate blade probe shown in FIG. 6.
FIG. 8 shows a side view cross-section of the dual arcuate blade probe shown in FIG. 7.

FIGS. 6~8 provide an alternative embodiment for dual arcuate blade probe 100. FIG. 6 presents a partial perspective view of dual arcuate blade probe 100. FIG. 7 presents a face view of the dual arcuate blade probe 100 shown in FIG. 6, and FIG. 8 presents a side view cross-section of the dual arcuate blade probe 100 shown in FIG. 6, along the probe axis 102.

As in FIGS. 1~5, the dual arcuate blade probe 100 shown in FIGS. 6~8 has a longitudinal probe axis 102, a shaft 104 concentric to the probe axis 102, and two separate arcuate edges 106, 108 providing a probe tip 110. In at least one embodiment, the two arcuate blade edges 106, 108 are provided at the end of blades 112 and 114, respectively.

In contrast to the embodiment illustrated in FIGS. 1~5, shown in FIGS. 6~8 is an embodiment wherein the self-cleaning space 600 is provided by two intersecting portions of at least two curved structures. More specifically, the self-cleaning space 600 shown in FIGS. 6~8 is formed by two intersecting curved surfaces 602, 604, each of which may be a portion of a cylinder, sphere, egg-shaped or other three-dimensionally curved surface. As shown, the curved surfaces 602, 604 intersect in first plane 308 (XZ plane) and taper from the central vertex area 152 to the arcuate blade edges 106, 108.

Debris materials entering into the self-cleaning space 600 along a path approximating the probe axis 102 will encounter either curved surface 602 or 604. As the curved slope of curved surfaces 602, 604 leads away from probe axis 102, the striking debris is deflected away from probe tip 110. As no cavity, bore or other open structure is provided within self-cleaning space 600, the self-cleaning space 600 is incapable of trapping and collecting flux residue debris or other materials.

With respect to the self-cleaning spaces 116 and 600, both are shown as symmetric with respect to the probe axis 102. This symmetry is a matter of design preference and may be advantageous for certain embodiments. In alternative embodiments, the self-cleaning space 116 or 600 may be askew from the center axis 102 and/or the center of tip 110. In further addition, self-cleaning spaces 116 and 600 are shown as simple sloped structures. In at least one alternative embodiment the surfaces defining the self-cleaning space (e.g. 150, 150', 200, 200', 500, 502, 602, 604) may contour so as to define a corkscrew-like channel or other deflecting passageway (not shown).

Figure 9:
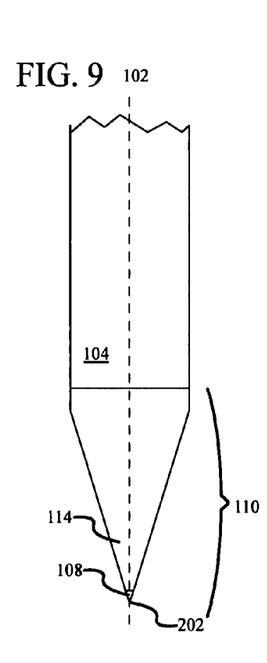
FIG. 9 is a side view of an embodiment of a dual arcuate blade probe.
Figure 10:
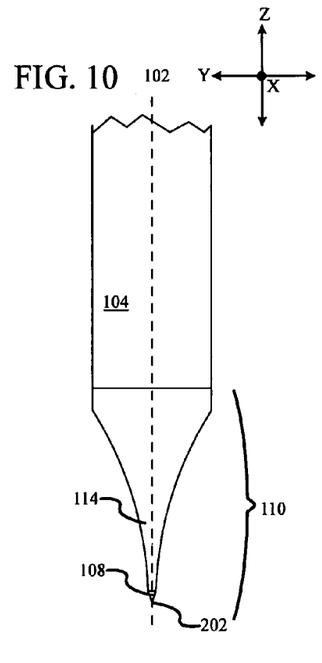
FIG. 10 is a side view of an alternative embodiment of a dual arcuate blade probe.
Figure 13:
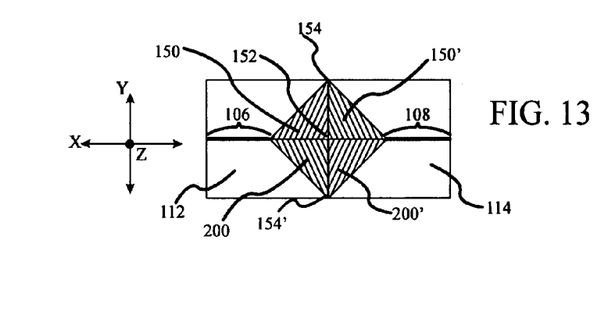
FIG. 13 is a blades end view of the dual arcuate blade probe shown in FIG. 9.

With respect to FIGS. 3 and 6 and the side cutaway views of FIGS. 2, 5 and 8, it is appreciated that arcuate edges 106, 108 are provided at the apex of tip 110, opposite from probe shaft 104 by a tapering structure coupled to the shaft 104. Indeed, in at least one embodiment, shaft 104 is itself tapered. Shown in FIGS. 9~12 are four side views of alternative embodiments for probe tip 110 of dual arcuate blade probe 100. More specifically, the tip 110 may taper at an angle with straight lines, as shown in FIG. 9. It may also have scalloped sides, as shown in FIG. 10. In yet another alternative embodiment, blades 112, 114 may be quite pronounced, as in FIG. 11. Blades 112, 114 may also taper quickly as in FIG. 12. FIG. 13 is a bottom view of the embodiment generally corresponding to FIGS. 1~3 and 9.

Figures 11, 12:
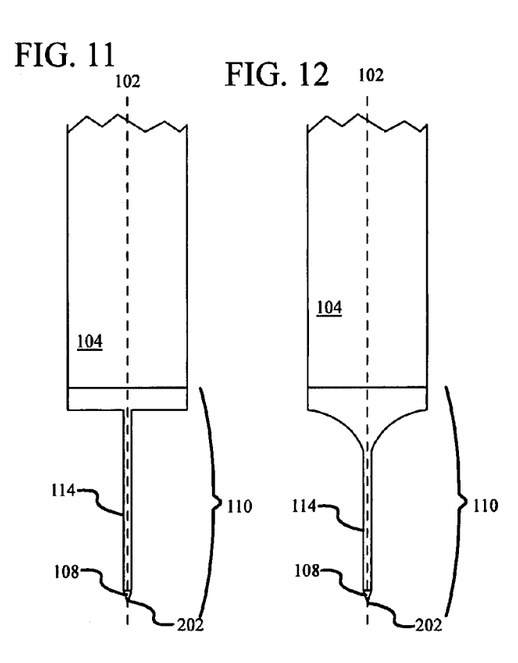
FIG. 11 is a side view of an alternative embodiment of a dual arcuate blade probe.
FIG. 12 is a side view of an alternative embodiment of a dual arcuate blade probe.

As shown in FIGS. 10~12, there is an additional taper to the end of tip 110, to insure that the proper edge angle is provided in achieving arcuate edges 106, 108. More specifically, it is intended that arcuate edges 106, 108 be sufficiently sharp so as to penetrate the surface of intended circuit nodes so as to establish proper electrical contact for testing purposes. Self-cleaning space 116 and 600 help insure that arcuate edges 106, 108 are not impeded from contacting a test node.

The face angle will be application specific and will depend on several factors including, but not limited to, the diameter of the probe shaft 104, the intended applied force during testing, the type of node being tested, the material forming the dual arcuate blade probe 100, and the material forming and/or covering the node to be tested (such as, for example, lead free solder). Generally, the face angle will be in a range from about ten degrees (10°) to about thirty five degrees (35°). The distance between the arcuate blade edges 106, 108 is set so that each edge hits the pad flange of the test target, thus avoiding the central pool of flux residue residing in the through hole. The profile for the arcuate edges 106, 108 and the face angle may be formed using manufacturing processes that are well understood in the field of art relating to electrical test probes, including but not limited to casting, milling, grinding, sharpening, polishing, stamping and combinations thereof.

So as to permit electrical testing of a node upon a circuit, the shaft is suitable for electrical coupling with test equipment and the probe tip 110 is suitable for electrically coupling to a node on a circuit. More specifically, the shaft 104 is formed from an electrically conductive material such as, but not limited to, brass, nickel, copper, beryllium, steel, stainless steel, aluminum, titanium and combinations thereof. In at least one embodiment, the shaft is formed from steel. In addition, the shaft 104 may be plated with conductive materials such as gold, silver or combinations thereof to further enhance the electrically conductive properties of the probe and/or prevent oxidation.

Figures 14, 15:
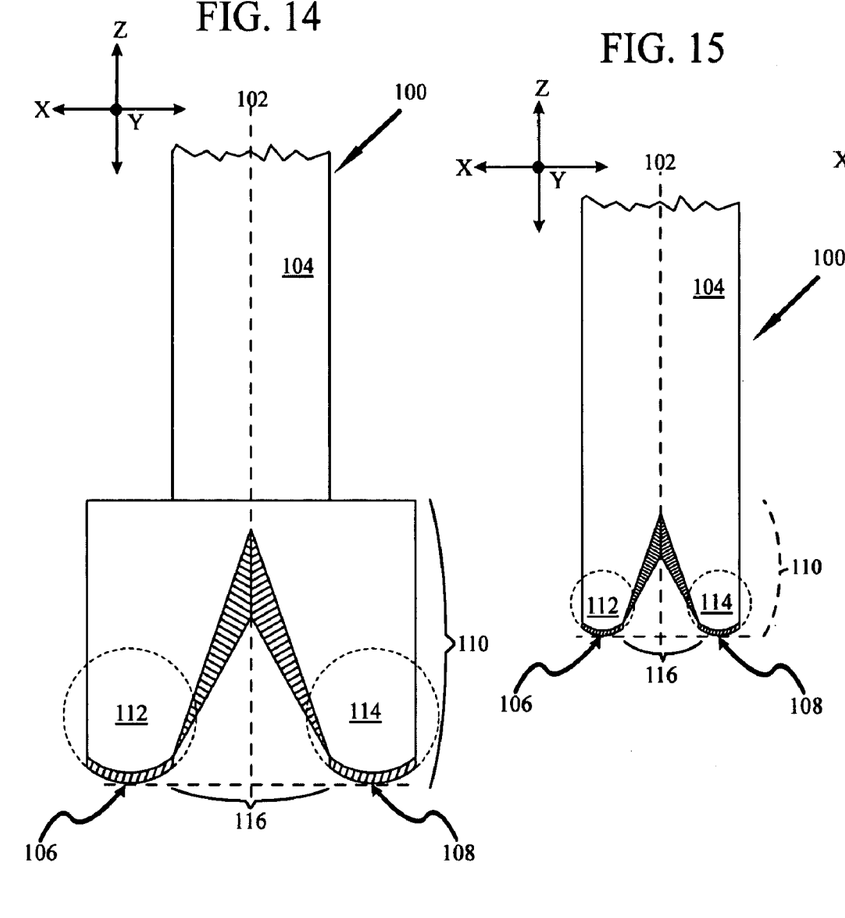
FIG. 14 is a plane face view of a headed embodiment of a dual arcuate blade probe.
FIG. 15 is a plane face view of a headless alternative embodiment of a dual arcuate blade probe.
Figure 16:
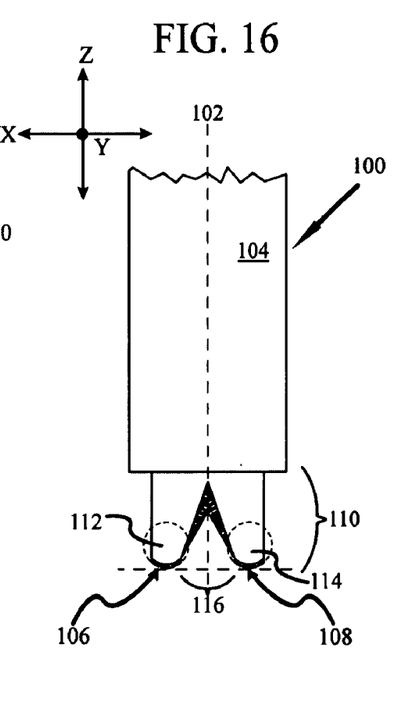
FIG. 16 is a plane face view of a tapered alternative embodiment of a dual arcuate blade probe.

As with the shaft, the arcuate edges 106, 108 are formed from an electrically conductive material such as, but not limited to, brass, nickel, copper, beryllium, steel, stainless steel, aluminum, titanium and combinations thereof. In at least one embodiment, the arcuate edges 106, 108 are formed from the same material providing the shaft 104. In addition, the arcuate edges 106, 108 may be plated with conductive materials such as gold, silver or combinations thereof to further enhance the electrically conductive properties of the probe and/or prevent oxidation FIGS. 1, 3, 5 and 7 have been rendered so as to help illustrate arcuate edges 106, 108, and by implication the tip 110 providing arcuate edges 106, 108 at the end of probe shaft 104. As shown in FIGS. 14~16, the distance between the apex of arcuate blade edges 106, 108 on the tip 110 may be varied while using the same shaft diameter. The distance between apexes may be equal or larger than the shaft, as in FIG. 14, or smaller than the shaft, as in FIGS. 15 and 16. The cross sectional width of the tip 110 may also be substantially the same as that of the probe shaft 104, as in FIG. 15. In at least one embodiment, the tip 110 is formed from shaft 104, as indicated by the dotted bracket identifying tip 110. Moreover, different embodiments may incorporate a distinct head element for the tip 110 as shown in FIG. 14, or an integrated head element for tip 110 as shown in FIG. 16.

Figure 17:
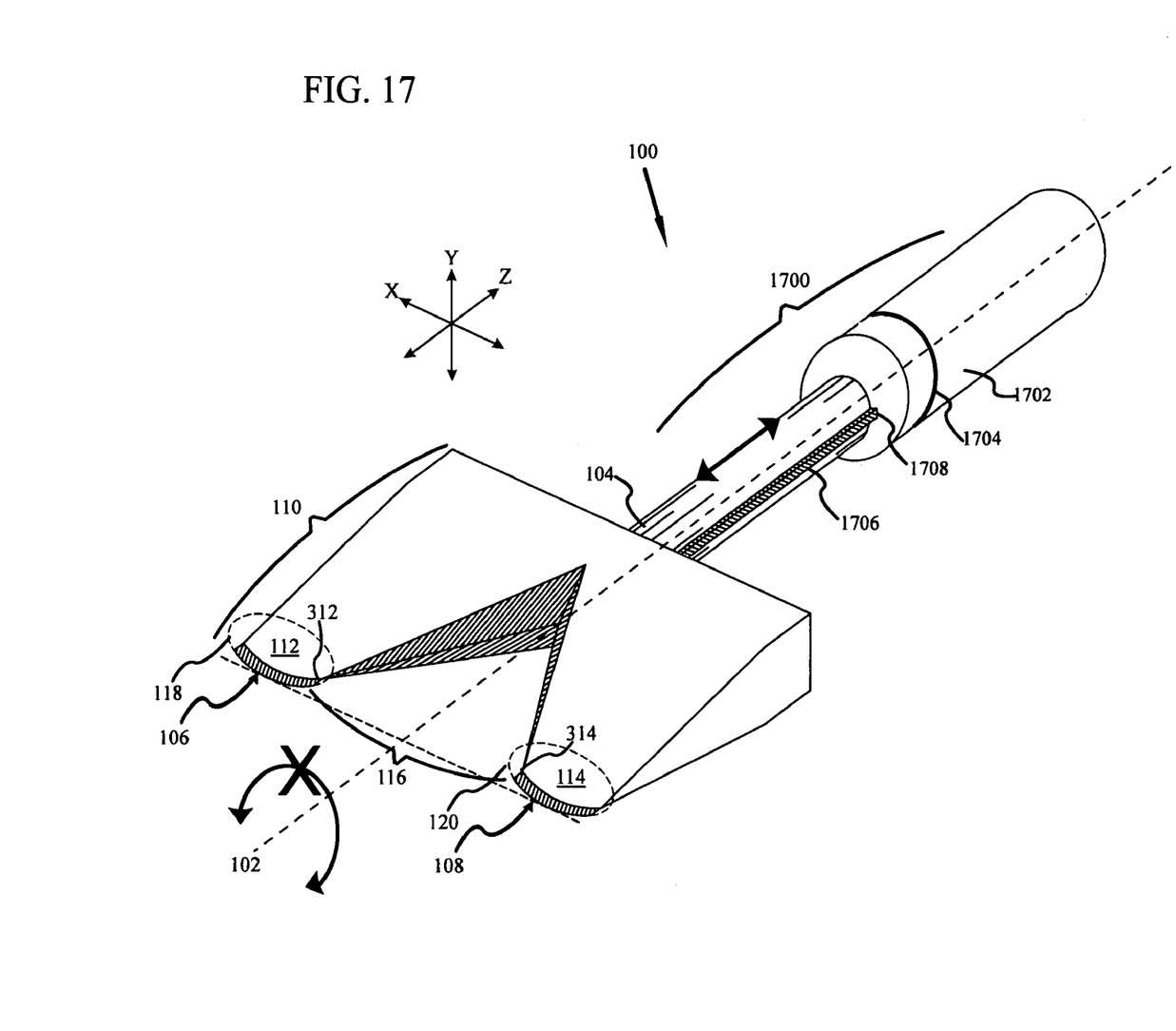
FIG. 17 is a partial perspective view of an arcuate blade probe including a plunger according to an alternative embodiment for a fixed orientation.

In addition, in at least one embodiment the shaft 104 includes a plunger. Specifically, a portion of shaft 104 opposite from the arcuate edges 106, 108 is a plunger 1700 as shown in FIG. 17. The plunger is structured and arranged to fit and be retained within a barrel 1702. The barrel 1702 provides a structure, such as a crimp 1704 that prevents the plunger 1700 from altogether exiting the barrel 1702, while allowing the plunger 1700 to travel or move within a range set by design within the barrel 1702 along the probe axis 102 as shown in FIG. 17.

Internal to the barrel 1702, and thus not shown, is a partially compressed spring abutting the end of the plunger 1700 and the end of the barrel 1702. When compressed to a set depth, typically a portion of the full travel, the spring provides a measured force to the plunger 1700 and thus the shaft 104 when the shaft is brought into contact with a node. In at least one embodiment, the plunger 1700 is allowed to freely rotate within the barrel 1702, so that the probe tip 110 consequently rotates about central axis 102.

In at least one alternative embodiment, the plunger 1700 and barrel 1702 may also be provided with a structure to prevent rotation of the dual arcuate blade probe 100. In at least one embodiment, such a rotation prevention structure, such as a tongue and grove arrangement, is internal to the barrel 1702. For illustrative purposes, an embodiment is shown wherein such a structure is a ridge 1706 along shaft 104 (and the plunger 1700 portion of the shaft 104) and grove 1708 in barrel 1702. The choice of a rotation prevention structure is a matter of design preference.

In at least one embodiment, the barrel of the dual arcuate blade probe 100 is structured and arranged to be received by a conductive receptacle or socket (not shown) which by features such as detents or mere friction holds onto the barrel 1702 of the dual arcuate blade probe 100. In at least one embodiment, the receptacle or socket does not allow the barrel 1702 to rotate after the barrel has been inserted into the receptacle or socket. The receptacle or socket is typically made part of test fixtures and is typically embedded in a non-conductive material and arranged in a matrix that matches the location of the nodes to be probed. Furthermore, this receptacle or socket is typically used to make connections within a test system from the test fixture and in effect connects the node through the probe to the electronics test equipment of the test system.

Figure 18:
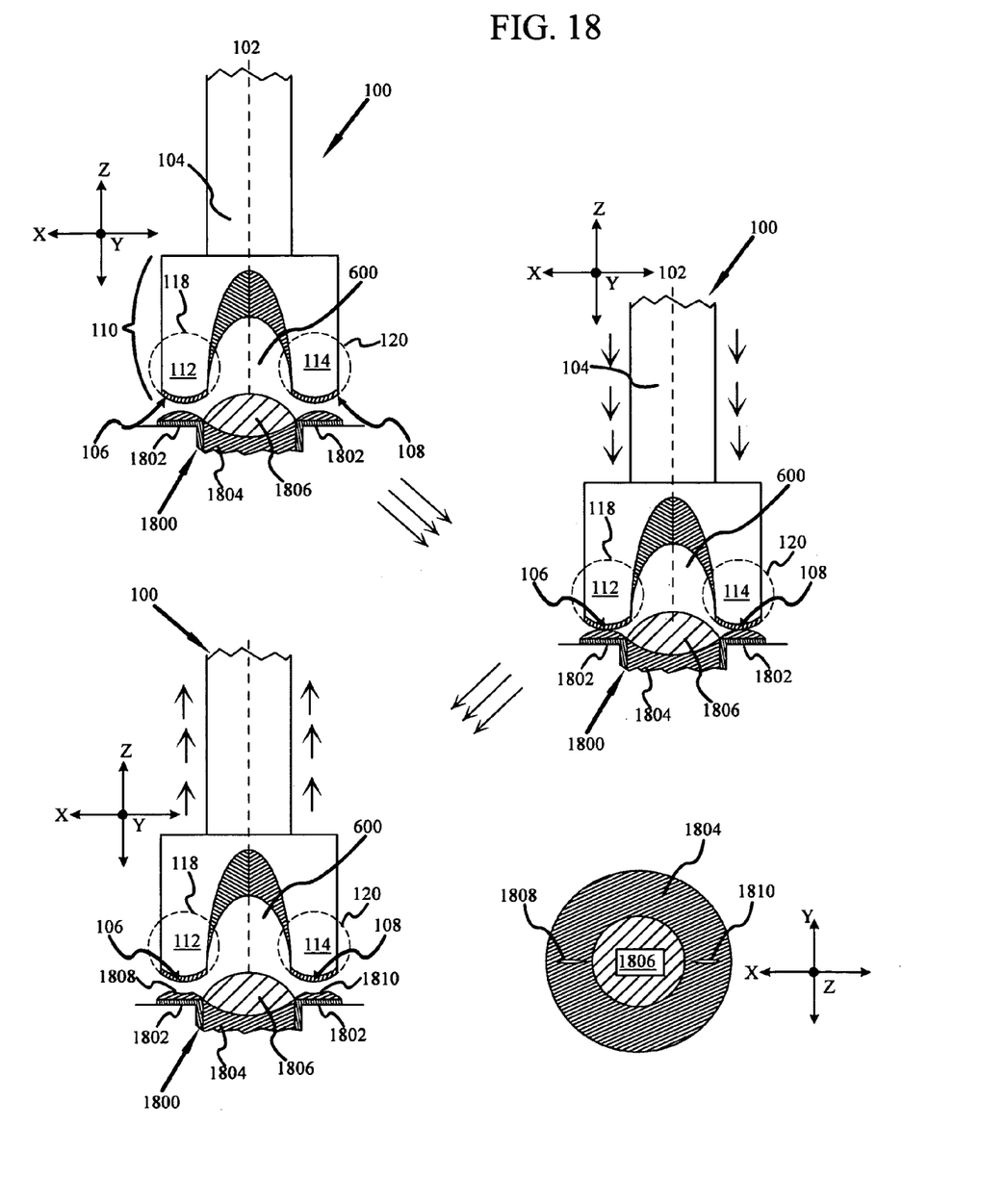
FIG. 18 shows a method of use for a dual arcuate blade probe according to an embodiment.

As stated above, the dual arcuate blade probe barrel 1702 is typically force fitted into a receptacle. Such a force fit may be used to provide a fixed preferred orientation for the dual arcuate blade probe 100 when it incorporates a structure to prevent rotation, that is, to provide a non-rotating probe or fixed orientation probe. During the testing process, it is not uncommon for a node to be slightly misaligned. When a testing probe is free to rotate about its axis, such misalignment may result in the probe rotating to a position that the arcuate blades 106, 108 miss the contact surface of the node 1804 as shown in FIG. 18. Such misalignment may reduce the quality or prevent altogether repeatable electrical contact and result in false readings and node failures.

Instead of resorting to test fixture repairs which can be expensive, time-consuming and result in production line down time, a non-rotating dual arcuate blade probe 100 that is best suited to the node width, taking the misalignment into account, may be used to insure that the arcuate blades 106, 108 do not miss the contact surface 1802 of the node 1800. In other words, a non-rotating dual arcuate blade probe 100 may be physically set in the test fixture to be aligned to effectively strike the misaligned node. As the dual arcuate blade probe 100 does not rotate, such re-alignment will be maintained. A fixed orientation probe may also be used to avoid undesired contact with conductive traces too near a node or to prevent damage to or contact with components nearby.

It is appreciated that there are a variety of different nodes on a circuit that may require testing. A particular type of node is known as a through hole. Holes and/or through holes are frequently used to mount components and/or provide board interconnections when reflowed solder is flowed into the hole to partially or completely fill the hole. During the reflow process, flux material will pool to the surface and solidify on top of the solder. This flux material may lie below the top of the hole, be flush with the top of the solder on the node or flood over it. Dual arcuate blade probe 100 advantageously overcomes the problems of testing hole nodes or through hole nodes encountered by other test probes.

As shown and described above, dual arcuate blade probe 100 provides two arcuate edges 106, 108. In certain embodiments, it may be desirable to provide a dual arcuate blade probe 100 with a greater plurality of arcuate edges; however, two arcuate edges is generally the preferred embodiment. As dual arcuate blade probe 100 provides two arcuate edges 106, 108, it is operable to make contact with the hole node at two single points, one point along each arcuate edge 106, 108.

Having described the physical structure of the dual arcuate blade probe 100, additional advantages of the structure may well be appreciated through the discussion of an embodiment for at least one method of use. This description is provided with reference to FIG. 18. It will be appreciated that the described method need not be performed in the order in which it is herein described, but that this description is merely exemplary of one method of using the dual arcuate blade probe 100.

As shown in the top left of FIG. 18, a dual arcuate blade probe 100 as described above is provided above a node hole 1800 for testing. The illustrations in FIG. 18 depict a cross section of node hole 1800 showing the pad 1802 and solder 1804 upon the pad and within the node hole 1800. Flux 1806 has pooled on top of the solder 1804 within the node hole 1800 upon the solder concave meniscus.

For a straight flat blade probe, a spear probe or a probe providing a single point of contact at the center of the node, the flux 1806 as shown poses a significant impediment to testing the node hole 1800. Flat bladed probes exhaust their force over large contact surface areas, thereby making it more difficult to penetrate the residue flux 1806. Higher spring forces may also be used with flat bladed probes or spear probes in an effort to insure penetration through the flux or residue material. Such higher spring forces may increase the chance of damage to the board.

As the dual arcuate blade probe 100 is urged into contact with the node hole 1800, each arcuate blade contacts a portion of solder 1804 upon the top-most part of solder mounds formed over the pad 1802. Dual arcuate blade probe 100 advantageously avoids attempts to reach solder 1804 within the hole through flux 1806. Should flux or other debris cover the node hole 1800, self-cleaning space 600 permits arcuate edges 106, 108 to contact the solder 1804 without encountering an obstruction. Moreover, should the flux 1806 extend over the top of the node at least part way into the self-cleaning space 600, it might not even contact the dual arcuate blade probe 100.

As discussed above, the arcuate edges 106, 108 are curved, and in at least one embodiment trace a portion of dotted circles 118 and 120. Due to surface tension as well as other factors, the surface of solder 1804 is generally not concave upon top pads 1802. Rather the solder 1804 upon the pads 1802 will tend to be convex. As a result, the curved structure of each arcuate edge 106, 108 will contact the surface of solder on pad 1802 over a minimal section with respect to each arcuate edge 106, 108 and thus minimal surface area, thereby maximizing the obtainable contact pressure. As the solder is softer than the material forming each arcuate edge 106, 108, each arcuate edge 106, 108 will be disposed into the solder 1804 (i.e., the node hole 1800), resulting in witness contact marks 1808, 1810.

Moreover, since the dual arcuate blade probe 100 only makes contact with the node at two points, the applied force from the shaft 104 to the node hole 1800 is only halved. More specifically, if a pressure force of twelve units (units are arbitrary) is applied to a single point, the full twelve units of pressure force are realized at that point. As the number of contact points increases (i.e., the area of contact increases) the contact pressure force realized at each point of contact decreases. With two points of contact, an applied twelve units of force results in six units of force at each contact point. With three points of contact, an applied twelve units of force is realized by each contact point as only four units of force.

Using probes of greater force to overcome flux residue, may risk damaging the board, the soldered nodes or the components, particularly when used in great numbers for probing high density boards. The greater pressure realized from lower probe forces attained by arcuate edges 106, 108 advantageously increases the probability that arcuate edges 106, 108 will electrically make contact with the surface of the node hole 1800 without destructive damage to the board, solder or node hole 1800.

As dual arcuate blade probe 100 is extracted from the node hole 1800, two curved indentations 1808, 1810 are left behind upon the node hole 1800. More specifically, in at least one embodiment the arcuate edges 106, 108 will impart witness marks in the form of crescent shaped indentations 1808, 1810 upon the node hole 1800. Curved indentations 1808, 1810 are advantageously unique to dual arcuate blade probe 100. Upon visual inspection of a tested hole node, an observer may easily determine whether a dual arcuate blade probe 100 was used in the testing process or determine the alignment accuracy of the probe on the fixture to the node.

Figure 19:
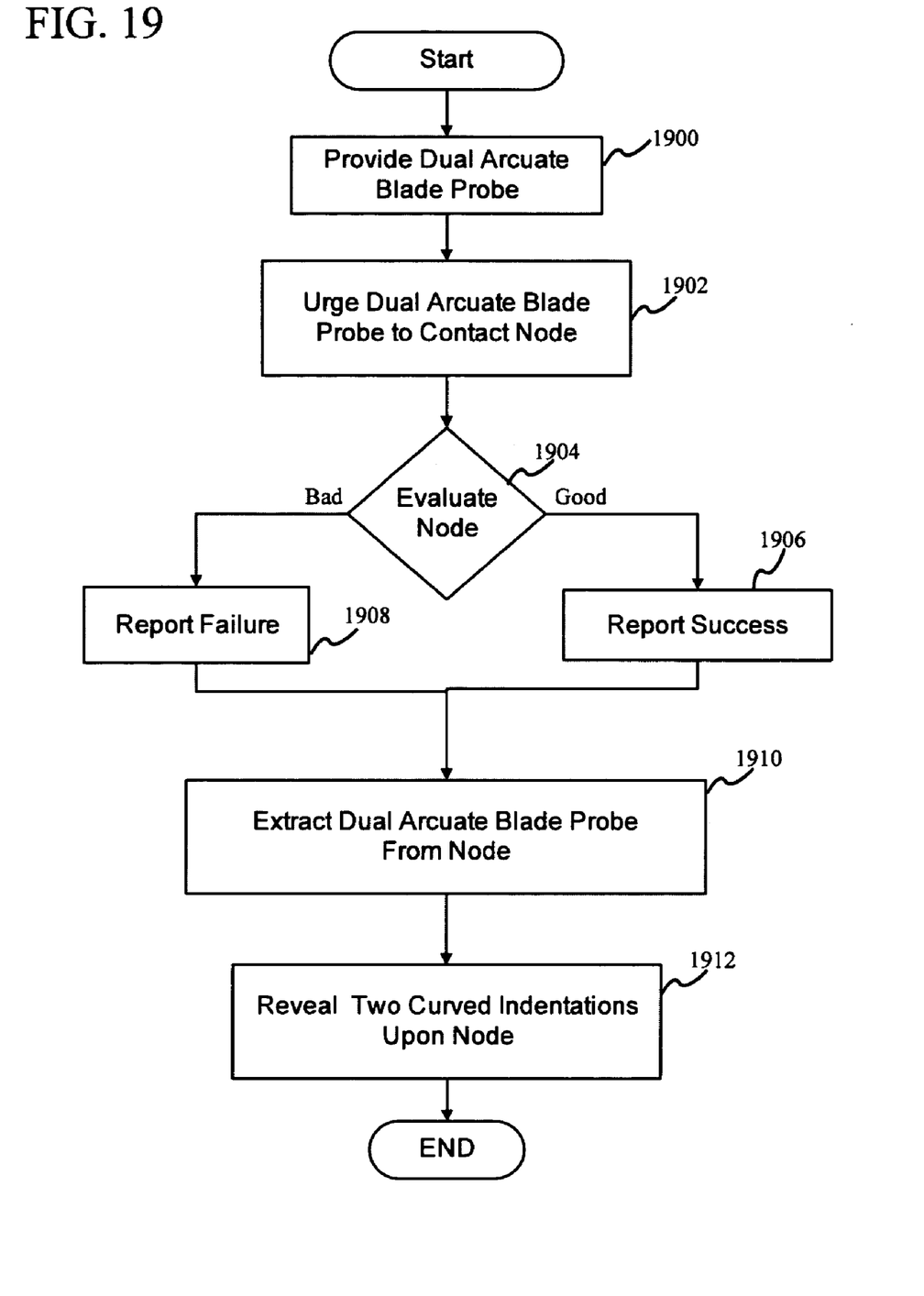
FIG. 19 is a high level flow diagram of the method of use.

This method is summarized in the flowchart of FIG. 19. The method commences by providing a dual arcuate blade probe 100 such as described above with respect to FIGS. 1~18, block 1900. The dual arcuate blade probe 100 is urged to contact the node, block 1902. More specifically, a point of each arcuate edge 106, 108 disposes into the node (see FIG. 18). Upon establishing contact between the dual arcuate blade probe 100 and node, the node is electrically evaluated, decision 1904. If the node evaluates as good, it may be reported or recorded as good, block 1906, and if the node evaluates as bad, it is reported as bad, block 1908. In at least one embodiment, circuits with bad nodes are discarded so as to save further processing costs.

Following evaluation, the dual arcuate blade probe 100 is extracted from the node, block 1910. As indicated above the extraction process leaves behind two curved indentations or witness marks upon the node, block 1912, which may be used to confirm use of dual arcuate blade probe 100 in the testing process.

Changes may be made in the above methods, systems, processes and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A dual arcuate blade probe tip for probing a node on a circuit, comprising:
   a longitudinal probe axis;
   a shaft made from an electrically conductive material, the shaft concentric to the probe axis; and
   two separate arcuate edges coupled to the shaft and positioned about the probe axis, each arcuate edge transverse to the probe axis.

2. The dual arcuate blade probe tip of claim 1, wherein each arcuate edge is provided by a tapering structure coupled to the shaft.

3. The dual arcuate blade probe tip of claim 1, wherein the probe tip is operable to make contact with the node at two points, one point along each arcuate edge, the points concentrating an applied force from the shaft to the node.

4. The dual arcuate blade probe tip of claim 3, wherein the points of contact are disposed apart from the probe axis.

5. The dual arcuate blade probe tip of claim 1, wherein the two arcuate edges are respective peaks of a wave edge, further comprising a trough between the peaks receding towards the shaft along the probe axis.

6. The dual arcuate blade probe tip of claim 1, further including a self-cleaning area between the two arcuate edges.

7. The arcuate blade probe tip of claim 1, wherein the arcuate blade probe is operable to produce two crescent shaped indentations upon the probed node.

8. A dual arcuate blade probe tip for probing a node on a circuit, comprising:
   a longitudinal probe axis;
   a shaft made from an electrically conductive material, the shaft concentric to the probe axis; and
   two blades coupled to the shaft on opposing sides of the probe axis and defining a self-cleaning space therebetween, each blade providing an arcuate edge, each arcuate edge transverse to the probe axis.

9. The dual arcuate blade probe tip of claim 8, wherein the self-cleaning space has a central area disposed between the two blades along a first axis, the self-cleaning space having an exit area above the central area along a second axis crossing the first axis.

10. The dual arcuate blade probe tip of claim 8, wherein the self-cleaning space is provided by two intersecting portions of at least two curved structures.

11. The dual arcuate blade probe tip of claim 8, wherein the self-cleaning space includes no semi-enclosed structure.

12. The dual arcuate blade probe tip of claim 8, wherein the arcuate edges of the blades lie in the same plane.

13. The dual arcuate blade probe tip of claim 8, wherein the shaft includes a plunger permitting movement of the shaft and the arcuate edges along the probe axis.

14. The dual arcuate blade probe tip of claim 8, wherein the shaft includes a plunger permitting movement of the shaft and the arcuate edges along the probe axis in a fixed orientation.

15. The arcuate blade probe tip of claim 8, wherein the arcuate blade probe is operable to produce two crescent shaped indentations upon the probed node.

16. A dual arcuate blade probe tip for probing a node on a circuit, comprising:
   a longitudinal probe axis;
   a shaft made from an electrically conductive material, the shaft concentric to the probe axis; and
   a wave edge extending from the shaft, the wave edge providing two curved peaks separated by a self-cleaning trough, each peak disposed on opposite sides of the probe axis.

17. The dual arcuate blade probe tip of claim 16, wherein the wave edge is transverse to the probe axis.

18. The dual arcuate blade probe tip of claim 16, wherein the self-cleaning trough is provided by two intersecting portions of at least two curved structures.

19. The dual arcuate blade probe tip of claim 16, wherein the shaft includes a plunger permitting movement of the shaft and the wave edge along the probe axis.

20. The dual arcuate blade probe tip of claim 16, wherein the shaft includes a plunger permitting movement of the shaft and the wave edge along the probe axis in a fixed orientation.

21. A dual arcuate blade probe tip for probing a node on a circuit, comprising:
   a longitudinal probe axis;
   a shaft made from an electrically conductive material, the shaft concentric to the probe axis;
   two tapered blades coupled to the shaft and disposed apart from the probe axis, the taper of each blade converging along the probe axis to define an arcuate edge transverse to the probe axis; and
   a self cleaning space between the two blades;
   wherein each arcuate edge is operative to make contact with the node at a single point along each arcuate edge when the edges and the node are urged into contact with each other, the single points of contact concentrating an applied force from the shaft to the node.

22. The dual arcuate blade probe tip of claim 21, wherein each blade tapers towards each respective arcuate edge.

23. The dual arcuate blade probe tip of claim 21, wherein the arcuate profile of each edge is a portion of one or more curved functions.

24. The dual arcuate blade probe tip of claim 21, wherein the shaft includes a plunger permitting movement of the shaft and the arcuate edges along the probe axis.

25. The dual arcuate blade probe tip of claim 21, wherein the shaft includes a plunger permitting movement of the shaft and the arcuate edges along the probe axis in a fixed orientation.

26. The dual arcuate blade probe tip of claim 21, wherein the self-cleaning space has a central area disposed between the two blades along a first axis, the self-cleaning space having an exit area above the central area along a second axis crossing the first axis.

27. The dual arcuate blade probe tip of claim 21, wherein the self-cleaning space is provided by two intersecting portions of at least two curved structures.

28. The dual arcuate blade probe tip of claim 21, wherein the self-cleaning space includes no semi-enclosed structure.

29. The arcuate blade probe tip of claim 21, wherein the arcuate blade probe is operable to produce two crescent shaped indentations upon the probed node.

30. A method of using a dual arcuate blade probe tip for probing a node on a circuit, comprising:
   providing a probe having:
   a longitudinal probe axis;
   a shaft made from an electrically conductive material, the shaft concentric to the probe axis; and
   two blades coupled to the shaft on opposing sides of the probe axis and defining a self-cleaning space therebetween, each blade providing an arcuate edge, each arcuate edge transverse to the probe axis;

urging the probe to contact the node, a point of each arcuate edge disposing into the node;

electrically evaluating the node; and extracting the probe from the node, the extraction revealing two curved indentations upon the node.

31. The method of claim 30, wherein the curved indentations are crescent shaped.

32. The method of claim 30, wherein each point of contact is disposed apart from the probe axis.

33. The method of claim 30, wherein the node is a through hole.

34. The method of claim 30, wherein the method concentrates an applied force from the shaft through the two arcuate edges.

* * * * *

UNITED STATES PATENT AND TRADEMARK OFFICE
CERTIFICATE OF CORRECTION

PATENT NO. : 7,279,912 B2 Page 1 of 1
APPLICATION NO. : 11/250032
DATED : October 9, 2007
INVENTOR(S) : Alexander Leon It is certified that error appears in the above-identified patent and that said Letters Patent is hereby corrected as shown below:

In column 7, line 1, delete "FIG. 1O." and insert -- FIG. 10. --, therefor.

Signed and Sealed this

Nineteenth Day of August, 2008

JON W. DUDAS
*Director of the United States Patent and Trademark Office*